(12) United States Patent
Shimoto et al.

(10) Patent No.: US 6,667,198 B2
(45) Date of Patent: Dec. 23, 2003

(54) METHOD AND PHOTO MASK FOR MANUFACTURING AN ARRAY SUBSTRATE

(75) Inventors: Shigeyuki Shimoto, Fukaya (JP); Shuichi Uchikoga, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/205,317

(22) Filed: Jul. 26, 2002

(65) Prior Publication Data

US 2003/0022421 A1 Jan. 30, 2003

(30) Foreign Application Priority Data

Jul. 27, 2001 (JP) ...................................... 2001-227314
Jul. 5, 2002 (JP) ...................................... 2002-197697

(51) Int. Cl.[7] ............................................. H01L 21/00
(52) U.S. Cl. ........................ 438/166; 438/487; 438/795
(58) Field of Search ................................. 438/149, 150, 438/166, 486, 487, 795, 798

(56) References Cited

U.S. PATENT DOCUMENTS 6,337,233 B2 * 1/2002 Yang ........................... 438/158
2002/0102821 A1 * 8/2002 Voutsas ....................... 438/487
2003/0017659 A1 * 1/2003 Takei et al. .................. 438/166
2003/0096489 A1 * 5/2003 Im et al. ...................... 438/487

FOREIGN PATENT DOCUMENTS

JP 11-64883 3/1999

OTHER PUBLICATIONS

J. S. Im, et al., Appl. Phys. Lett., vol. 70, No. 25, pp. 3434–3436, "Single–Crystal Si Films for Thin–Film Transistor Devices," Jun. 23, 1997.

* cited by examiner

Primary Examiner—Tuan H. Nguyen
(74) Attorney, Agent, or Firm—Oblon, Spivak, McClelland, Maier & Neustadt, P.C.

(57) ABSTRACT

A method of manufacturing an array substrate comprising; depositing an amorphous material on a transparent substrate; and changing the amorphous material to a polycrystalline material by irradiation of energy beams through a photo mask, the mask including a transparent region permitting the energy beams to pass through and a shutoff region surrounding the transparent region and interrupting the energy beams, wherein changing the amorphous material to the polycrystalline material includes: moving the transparent substrate by a constant distance perpendicularly to the lengthwise direction of a flat pattern projected onto the surface of the amorphous material when energy beams passing through the transparent region are irradiated onto the amorphous material; and irradiating the energy beams onto the amorphous material every time when the transparent substrate is moved.

10 Claims, 9 Drawing Sheets

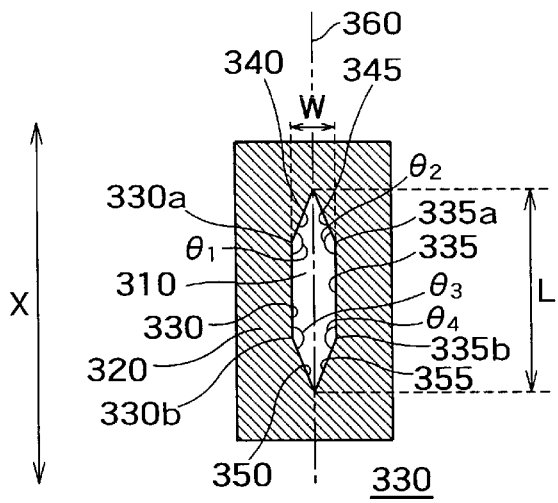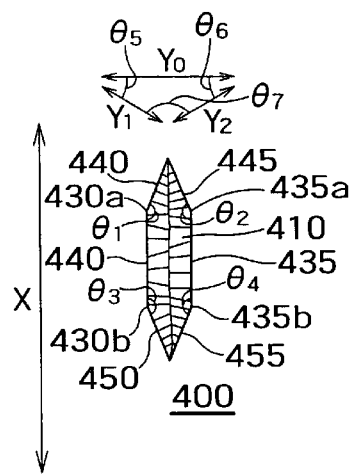
FIG. 2A    FIG. 2B
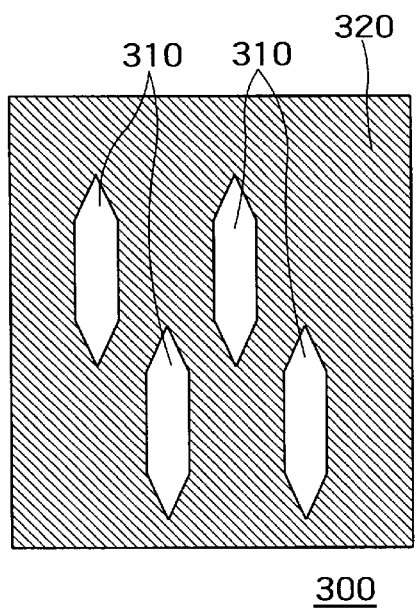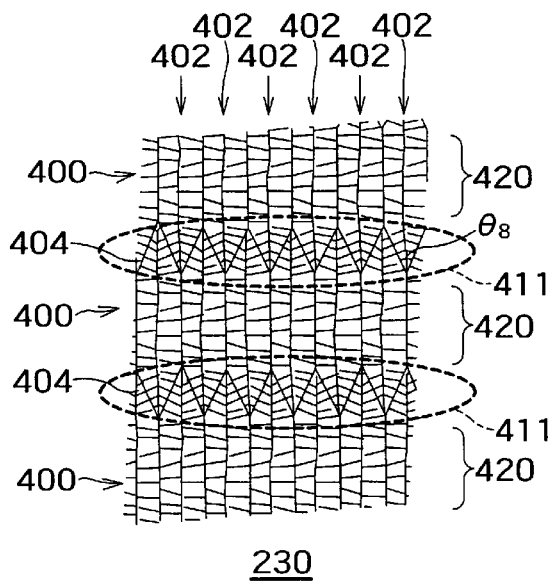
FIG. 3A    FIG. 3B

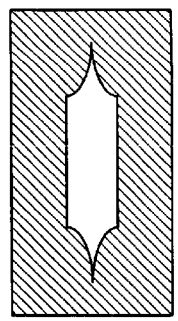 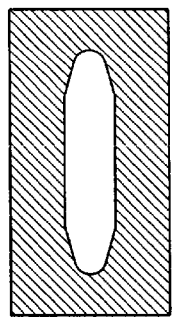 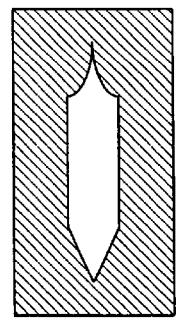
FIG. 6A   FIG. 6B   FIG. 6C
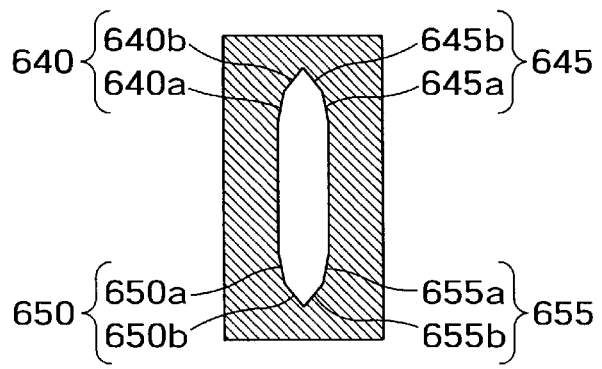
FIG. 6D
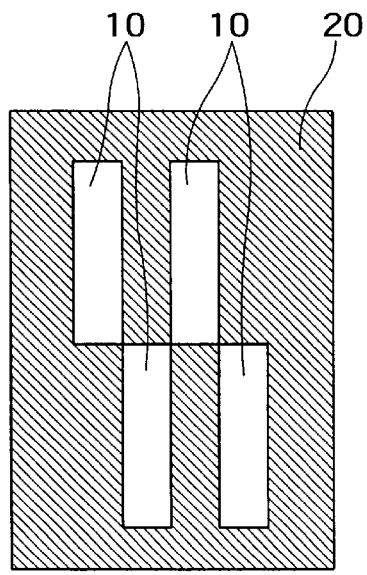
PRIOR ART
FIG. 7A
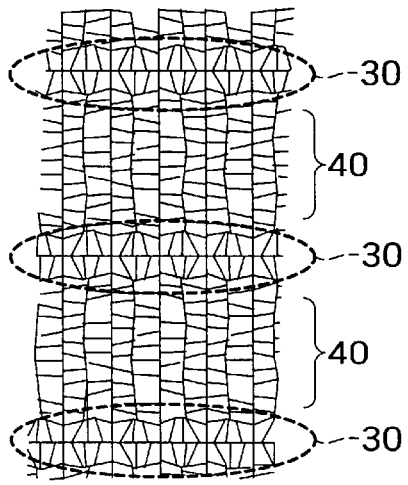
PRIOR ART
FIG. 7B

METHOD AND PHOTO MASK FOR MANUFACTURING AN ARRAY SUBSTRATE

CROSS-REFERENCE TO RELATED APPLICATIONS

This application is based upon and claims the benefit of priority from the prior Japanese Patent Applications No. 2002-197697, filed on Jul. 5, 2002, and No. 2001-227314, filed on Jul. 27, 2001, the entire contents of which are incorporated herein by reference.

BACKGROUND OF THE INVENTION

1. Field of the Invention

This invention relates to a method and a photo mask for manufacturing an array substrate.

2. Related Background Art

Liquid crystal display devices (hereinbelow also called LCD) have recently brought into wide use in personal computers, projection-type television sets, compact television sets, portable information terminals, and so on. The main stream of currently existing LCDs is active matrix LCD in which thin-film transistors (hereinbelow also called TFT), which are semiconductor elements, are provided for individual pixels.

Active matrix LCD is made up by confining a liquid crystal between an array substrate having a display electrode and a filter substrate having a common electrode opposed to the display electrode. A TFT array substrate having TFTs in a matrix arrangement is frequently used as such array substrate. The TFT array substrate has a plurality of signal lines connected to TFT sources, and a plurality of scanning lines connected to TFT gates, which intersect in form of a grating. As the active layer of TFT, amorphous silicon or polysilicon is used.

If polysilicon having a larger mobility than amorphous silicon is employed as the semiconductor material, part of the drive circuit for displaying images can be formed on the array substrate. As a result, some parts having been attached externally of a cell panel can be omitted. This resulted in lowering the manufacturing cost and a compact outer frame of the LCD display.

If more drive circuits are built on the array substrate, its cost will be further lowered and the function will be enhanced.

However, array substrates using currently available polysilicon as their semiconductor material still allow only a limited number of drive circuits to be built on. Therefore, circuits other than those built on the substrate are still located externally of the array substrate.

To build more drive circuits on an array substrate, mobility of polysilicon is preferably high. Increasing the grain size of polysilicon would improve the mobility of the polysilicon.

There is a method for enlarging the grain size of polysilicon by irradiating energy beams such as laser beams onto an amorphous silicon film, there by producing solid/liquid interface, and using a temperature profile along the interface to grow the crystal laterally in parallel to the plane of the array substrate. This method is called the lateral growth method.

The lateral growth method irradiates energy beams such as laser beams on an initial film on the substrate via a photo mask, for example. In this case, crystal growth direction depends on the profile of the energy beams formed by the photo mask.

FIG. 7A is a fragmentary, enlarged view of a conventional photo mask 100. The photo mask 100 includes rectangular transparent regions 10 and shutoff regions 20. The energy beams passing through the aperture 10 melt the amorphous silicon (or polysilicon). Once the irradiation of energy beams is completed, crystal grows from the interface between solid phase portions and liquid phase portions of silicon (hereinbelow also called solid-liquid interface) toward the inside.

FIG. 7B is an enlarged plan view of crystal grains of polysilicon after irradiation of energy beams. In the lateral growth process, crystal grows from the solid-liquid interface. Thus the crystal growth direction is different between the short side and the long side of the transparent region 10. Therefore, crystal grains 30 grown from short side and crystal grains 40 grown from the long side are different in lengthwise direction of crystal grains. Especially because the transparent region 10 was rectangular, lengthwise directions of the crystal grains 30 and the crystal grains 40 were intersecting approximately at a right angle.

FIG. 8 is a plan view that schematically shows placement of TFTs 60, 70, 80, 90 formed by using conventional polysilicon as their active layers 50. TFTs 60, 70, 80, 90 each include a gate electrode 110, source electrode 120 and drain electrode 130.

When a voltage is applied to the gate electrode 110, each TFT turns ON. That is, the active layer under the gate electrode 110 reverses, and forms a channel. The channel allows a current to flow between the source electrode 120 and the drain electrode 130.

While TFTs 60, 70, 80, 90 are OFF, the current leaking out between each source electrode 120 and the associated drain electrode 130 had better be small. On the other hand, when the TFTs 60, 70, 80, 90 are ON, the resistance value (referred to as ON resistance) between each source electrode 120 and the associated drain electrode 130 had better below. Further, TFTs 60, 70, 80, 90 preferably have constant properties.

In general, when the flow direction of carriers of TFT substantially coincides with the lengthwise direction of polysilicon crystal grains, carriers exhibit a higher mobility. As the mobility of carriers is high, the ON resistance decreases. On the other hand, as the flow direction of carriers deviates from the lengthwise direction of crystal grains toward 90 degrees therefrom, the mobility of carriers becomes lower because carriers must pass through more grain boundaries and more of them will be scattered.

In the conventional polysilicon active layer 50, because the transparent region 10 is formed rectangle, lengthwise directions of crystal grains 30 and 40 intersect substantially at a right angle. Therefore, the conventional technique has the problem that carrier mobility is relatively low in TFT 90, although it is relatively high in the other TFTs 60, 70 and 80.

The conventional technique also has the problem that TFTs 60, 70, 80, and 90 cannot exhibit constant properties.

Attempts to prevent those problems invite a design constraint that disables TFTs to be formed in regions where crystal grains 30 exist. Further, for forming TFTs in regions where crystal grains 30 do not exist, the manufacturing process will need an additional process for positional alignment.

SUMMARY OF THE INVENTION

According to an embodiment of the invention, there is provided a method of manufacturing an array substrate comprising:

depositing an amorphous material on a transparent substrate; and changing the amorphous material to a polycrystalline material by irradiation of energy beams through a photo mask, the mask including a transparent region permitting the energy beams to pass through and a shutoff region surrounding the transparent region and interrupting the energy beams, the transparent region being defined by first and second lengthwise direction lines extending substantially in parallel to each other, first and second slanting direction lines which extend from opposed ends of the lengthwise direction lines after declining by angles larger than 90 degrees to join with each other; and third and fourth slanting direction lines which extend from the other opposed ends of the lengthwise direction lines after declining by angles larger than 90 degrees to join with each other, the transparent region having a length in the extending direction of the first and second lengthwise direction lines, which is longer than the length of the transparent region in the direction perpendicular to the extending direction of the first and second lengthwise direction lines, wherein changing the amorphous material to the polycrystalline material includes: moving the transparent substrate by a constant distance perpendicularly to the lengthwise direction of a flat pattern projected onto the surface of the amorphous material when energy beams passing through the transparent region are irradiated onto the amorphous material; and irradiating the energy beams onto the amorphous material every time when the transparent substrate is moved.

According to a further embodiment of the invention, there is provided a method of manufacturing an array substrate comprising:

depositing an amorphous material on a transparent substrate; and changing the amorphous material to a polycrystalline material made of crystal grains by irradiation of energy beams through a photo mask permitting the energy beams to pass through, the photo mask including an elongated transparent region configured to permit the crystal grains to grow in directions not crossing at right angles when the energy beams are irradiated onto the amorphous material, the photo mask further including a shutoff region surrounding the transparent region to interrupt the energy beams, wherein changing the amorphous material to a polycrystalline material includes: moving the transparent substrate by a constant distance perpendicularly to the lengthwise direction of a flat pattern projected onto the surface of the amorphous material when energy beams pass through the transparent region and are irradiated onto the amorphous material; and irradiating the energy beams onto the amorphous material every time when the transparent substrate is moved.

According to a still further embodiment of the invention, there is provided a photo mask permitting energy beams emitted from an energy source to pass through to change an amorphous material to a polycrystalline material, comprising:

a transparent region permitting the energy beams to pass through and defined by first and second lengthwise direction lines extending substantially in parallel to each other, first and second slanting direction lines which extend from opposed ends of the lengthwise direction lines after declining by angles larger than 90 degrees to join with each other, and third and fourth slanting direction lines which extend from the other opposed ends of the lengthwise direction lines after declining by angles larger than 90 degrees to join with each other; and a shutoff region surrounding the transparent region to interrupt the energy beams, wherein the transparent region has a length in the extending direction of the first and second lengthwise direction lines, which is longer than the length of the transparent region in the direction perpendicular to the extending direction of the first and second lengthwise direction lines.

BRIEF DESCRIPTION OF THE DRAWINGS

FIG. 2A is a fragmentary, enlarged view of a photo mask through which energy beams irradiated to amorphous silicon can pass;

FIG. 2B is an enlarged plan view that shows a mass of polysilicon crystal grains formed by using a photo mask;

FIG. 3A is a fragmentary, enlarged plan view that shows a plurality of transparent regions of the photo mask shown in FIG. 2A;

FIG. 3B is a fragmentary, enlarged plan view of polysilicon after irradiation of energy beams through the photo mask shown in FIG. 3A;

FIG. 6A is a diagram that shows an alternative form of each transparent region 310 of a photo mask 300;

FIG. 6B is a diagram that shows a further alternative form each transparent region 310 of the photo mask 300;

FIG. 6C is a diagram that shows a still further alternative form each transparent region 310 of the photo mask 300;

FIG. 6D is a diagram that shows a yet further alternative form each transparent region 310 of the photo mask 300;

FIG. 7A is a fragmentary enlarged view of a conventional photo mask;

FIG. 7B is a enlarged plan view of crystal grains of polysilicon after irradiation of energy beams;

DETAILED DESCRIPTION OF THE INVENTION

Some embodiments of the invention will be explained below with reference to the drawings. These embodiments, however, should not be construed to limit the invention.

Figure 1A:
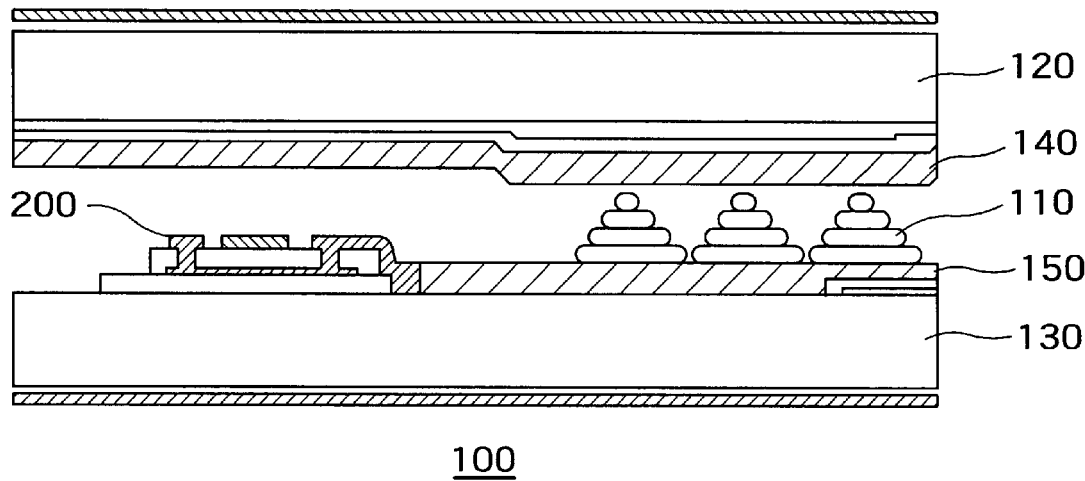
FIG. 1A is an enlarged cross-sectional view of a liquid crystal display device using a TFT substrate, which is manufactured by a manufacturing method according to an embodiment of the invention.

FIG. 1A is an enlarged, cross-sectional view that roughly shows a TFT array substrate 130 manufactured by a method according to an embodiment of the invention, and a liquid crystal display device 100 using the TFT array substrate 130.

In the liquid crystal device 100, a liquid crystal 110 is sealed between a color filter substrate 120 and the TFT array substrate 130. The color filter substrate 120 has a common electrode 140, and the TFT array substrate 130 has a display electrode 150. Thus the common electrode 140 and the display electrode 150 apply an electric field to the liquid crystal 110.

The display electrode 150 is connected to the drain of TFT 200 located on the TFT array substrate 130. A number of TFTs 200 are formed on the TFT array substrate 130 in a matrix arrangement.

TFT 200 illustrated is of a positive stagger type, but TFT of an opposite stagger type may be used alternatively. The TFT array substrate 130 is illustrated as being used in a liquid crystal device, but it may be used as in other type displays such as EL displays.

Figure 1B:
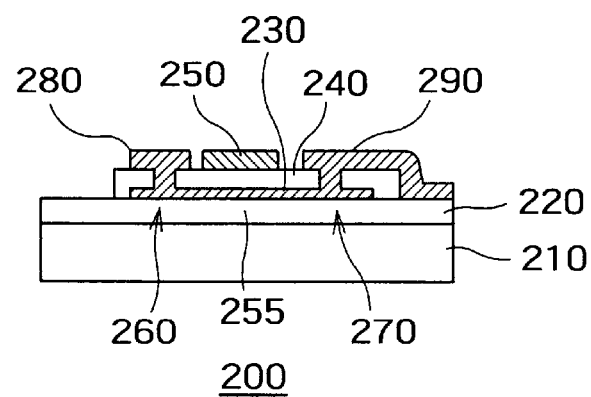
FIG. 1B is an enlarged cross-sectional view of TFT used in a TFT array substrate.

FIG. 1B an enlarged cross-sectional view of TFT 200 used in the TFT array substrate 130 manufactured by a method according to an embodiment of the invention. TFT 200 is formed on an insulating glass substrate 210. The method for manufacturing the TFT array substrate 130 will be explained later with reference to FIG. 9A through FIG. 16.

To fabricate TFT 200, an insulating film 220 is deposited on the insulating glass substrate 210, and polycrystalline silicon (also called polysilicon) 230 is formed on the insulating film 220. The polysilicon 230 is formed in the following manner. First, amorphous silicon is formed on the insulating film 220. Next, appropriate energy beams such as excimer laser beams, which are emitted from an energy source, are irradiated onto the amorphous silicon through a photo mask (see FIGS. 2A to FIG. 3B). Thus the amorphous silicon melts and produces solid/liquid interface. Then, by using a temperature gradient, the amorphous silicon is crystallized (lateral growth). Therefore, the amorphous is changed to polysilicon 230 by energy beams, and forms channel portions 255 of TFTs.

Further, a gate insulating film 240 is deposited on the polysilicon 230 to form gate electrodes 250. Thereafter, an impurity is injected using the gate electrode 250 as a mask. As a result, source regions 260 and drain regions 270 are formed in self-alignment at opposite sides of channel portions 255 in the polysilicon 230. Next, contact holes are formed to reach the source regions 260 and the drain regions 270. Further, source electrodes 280 to be connected to the source regions 260 and drain electrodes 290 to be connected to the drain regions 270 are formed.

FIG. 2A is a fragmentary, enlarged view of the photo mask 300 through which the energy beams irradiated to the amorphous silicon can pass. The photo mask 300 includes transparent regions 310 permitting the energy beams to transmit, and shutoff regions 320 coated with Cr (chromium) to intercept the energy beams. FIG. 2A shows only one transparent region 310 and the shutoff region 320 around it.

The transparent region 310 of the photo mask 300 according to the instant embodiment of the invention is defined by two lengthwise direction lines 330, 335 extending substantially in parallel; two slanting direction lines 340, 345 that extend from opposed ends 330a, 335a of the lengthwise direction lines 330, 335 after declining by angles $\theta_1$ and $\theta_2$ larger than 90 degrees to join with each other; and two slanting direction lines 350, 355 that extend from the other opposed ends 330b, 335b of the lengthwise direction lines 330, 335 after declining by angles $\theta_3$ and $\theta_4$ larger than 90 degrees to join with each other. Length L of the transparent region 320 in the direction parallel to the lengthwise direction lines 330, 335 is longer than the size (width) W of the transparent region 320 in the direction perpendicular to the lengthwise direction.

In the instant embodiment, each of the slanting direction lines 340, 345, 350, 355 is shorter than the lengthwise direction line 330 or 335.

In this embodiment, all of the length wise direction lines 330, 335 and the slanting direction lines 340, 345, 350, 355 are straight. All of the angles $\theta_1$, $\theta_2$, $\theta_3$ and $\theta_4$ are equal obtuse angles larger than 90 degrees. The length wise direction lines 330, 340 are substantially equal in length. Similarly, the slanting direction lines 340, 345, 350, 355 are substantially equal in length.

Therefore, in the instant embodiment, the transparent region 310 has the form of a hexagon having the lengthwise direction X, and symmetrical about the centerline 360 parallel to and between the lengthwise direction lines 330 and 335.

The length L in the lengthwise direction X and the width W of the transparent region 310 are limited by an optical system for processing energy beams from the energy source, an apparatus of the energy source, etc.

The photo mask 300 according to the instant embodiment of the invention additionally includes the shutoff region 320 around the transparent region 310 to intercept energy beams.

Therefore, energy beams emitted from the energy source are shaped by the photo mask 300 when transmitting through the photo mask 300. The energy beams passing through the photo mask 300 changes an amorphous material to a polycrystalline material made up of crystal grains.

Crystal grains usually grow by making use of a temperature gradient at the solid/liquid interface after irradiation of energy beams. So the crystal grains start growing from perimeters of transparent regions of the photo mask.

The perimeters of the transparent region 310 form an elongated hexagon having the length wise direction. Therefore, the polysilicon crystallized by using the photo mask 300 according to the embodiment is made up of crystal grain masses 400 each being an aggregation of crystal grains as shown in FIG. 2B. As such, each crystal grain mass 400 is an aggregation of crystal grains, having a plan-view form determined by the shape of each transparent region of the photo mask 300.

FIG. 2B is an enlarged plan view that shows one of masses of polysilicon crystal grains formed by using the photo mask 300. The crystal grain mass 400 has the same form as the transparent region 310. That is, the crystal grain mass 400 in this embodiment is defined by two lengthwise direction lines 430, 435 extending substantially in parallel; two slanting direction lines 440, 445 shorter than the lengthwise direction lines 430, 435, which extend from opposed ends 430a, 435a of the length wise direction lines 430, 435 after declining by angles $\theta_1$ and $f_2$ larger than 90 degrees to join with each other; and two slanting direction lines 450, 455 shorter than the lengthwise direction lines 430, 435, which extend from the other opposed ends 430b, 435b of the lengthwise direction lines 430, 435 after declining by angles $\theta_3$ and $\theta_4$ larger than 90 degrees to join with each other.

Length L of the transparent region 320 in the direction parallel to the lengthwise direction lines 430, 435 of the mass 400 is longer than the size (width) W of the transparent region 320 in the direction perpendicular to the lengthwise direction.

In the instant embodiment, each of the slanting direction lines 440, 445, 450, 455 is shorter than the lengthwise direction line 430 or 435.

The crystal grain mass 400 shown in FIG. 2B includes a number of crystal grains 410 having one of lengthwise directions $Y_0$, $Y_1$ and $Y_2$. These crystal grains 410 have shapes having any of lengthwise directions $Y_0$, $Y_1$ and $Y_2$, which substantially coincide with growth directions of respective crystal grains 410. Since the angles $\theta_1$, $\theta_2$, $\theta_3$, $\theta_4$ are all obtuse angles larger than 90 degrees, the lengthwise directions $Y_0$, $Y_1$ and $Y_2$ do not intersect at right angles with each other.

Angle $\theta_5$ made between the lengthwise directions $Y_0$, $Y_1$ is $\theta_5=180°-\theta_1$, angle $\theta_6$ made between the lengthwise directions $Y_0$, $Y_2$ is $\theta_6=180°-\theta_2$, and angle $\theta_7$ made between the lengthwise directions $Y_2$, $Y_0$ is $\theta_6=180-\theta_3$.

Therefore, as the angles $\theta_1$, $\theta_2$, $\theta_3$, $\theta_4$ become closer to 180 degrees, the lengthwise directions $Y_0$, $Y_1$, $Y_2$ become closer to parallel lines. In this embodiment, however, as the angles $\theta_1$, $\theta_2$, $\theta_3$, $\theta_4$ become closer to 180 degrees, the slanting direction lines 440, 445, 450, 455 of the crystal grain mass 400, i.e. the slanting direction lines 340, 345, 350, 355 of the transparent region 310 of the photo mask 300, must be made longer. However, as already explained, since the length L of the lengthwise direction X of the transparent region 310 is limited by the optical system for processing the energy beams, apparatus of the energy source, etc., these angles $\theta_1$, $\theta_2$, $\theta_3$, $\theta_4$ are also limited. This limitation is determined by the length L of the lengthwise direction X, width W, energy beams used, and others.

FIG. 3A is a fragmentary, enlarged plan view that shows a plurality of transparent regions 310 of the photo mask 300 shown in FIG. 2A.

The transparent regions 310 shown in FIG. 3A are aligned side by side in the widthwise direction perpendicular to the lengthwise direction, and the transparent regions 310 in a row are shifted in the lengthwise direction of the transparent regions 310 from the transparent regions 310 in the next row. The photo mask 300, however, may define very long transparent regions 310 aligned side-by-side only in the widthwise direction.

FIG. 3B is a fragmentary, enlarged plan view of polysilicon 230 after irradiation of energy beams through the photo mask 300 shown in FIG. 3A.

When energy beams are irradiated through the photo mask 300, the glass substrate 210 (see FIG. 1B) is moved every shot of irradiation. As a result, the polysilicon 230 as shown in FIG. 3B is obtained.

As shown in FIG. 3B, the polysilicon 230 is made up of a number of columns 402 of crystal grain masses 400, each column 402 being made up of a number of crystal grain masses 400 substantially equal in elongated shape having the lengthwise direction X and aligned in the direction of their lengthwise directions X. Crystal grain masses 400, which are adjacent each other in the direction of their lengthwise directions X, are shifted a half pitch of the width of the crystal grain mass 400.

The polysilicon 230 is used as an active layer forming channel portions of TFTs 200.

Among the crystal grain masses 400, zigzag grain boundary lines 404 are formed by slanting direction lines of a number of crystal grain masses 400. Therefore, the polysilicon 230 includes zigzag regions 411 in which the grain boundary lines 404 appear, and parallel regions 420 in which lengthwise direction lines of the crystal grain masses 400 appear and their lengthwise directions are substantially parallel. The deflection angle $\theta_8$ of the grain boundary lines 404 depends on the angles $\theta_1$, $\theta_2$, $\theta_3$ and $\theta_4$. That is, the angle $\theta_8$ is one of $\theta_8=2(180-\theta_1)$, $\theta_8=2(180-\theta_2)$, $\theta_8=2(180-\theta_3)$ and $\theta_8=2(180-\theta_4)$.

Figure 4:
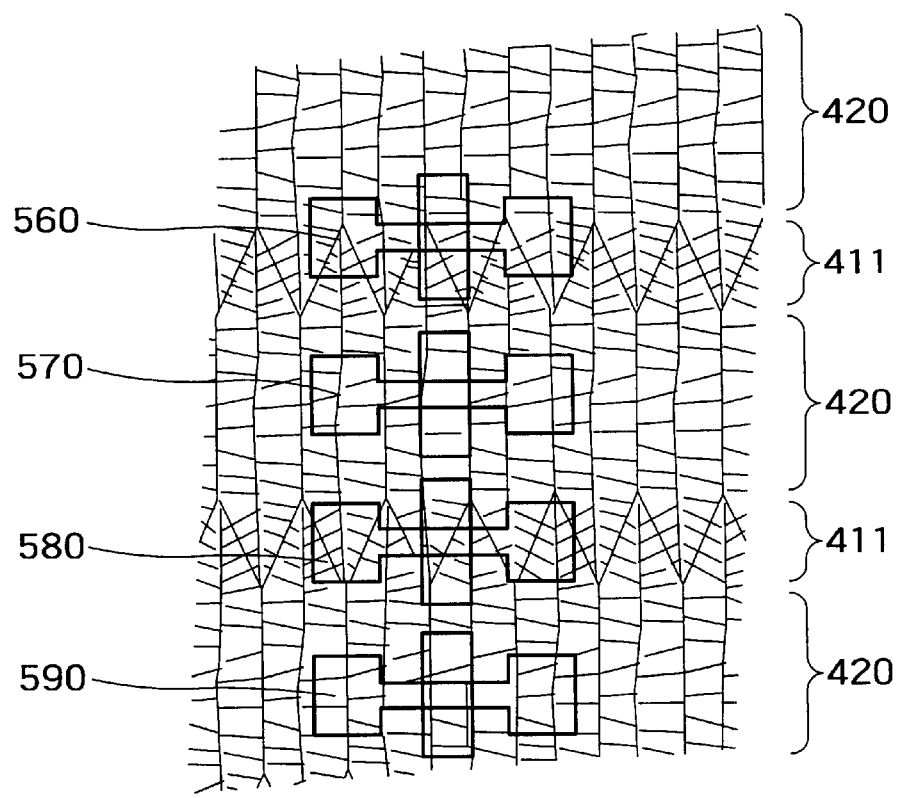
FIG. 4 is a plan view that schematically shows a layout of TFTs formed by using polysilicon 230 as the active layer.

FIG. 4 is a plan view that schematically shows a layout of TFTs formed by using polysilicon 230 as the active layer to form TFTs 560, 570, 580, and 590.

TFTs 560, 580 are located in zigzag regions 411 whereas TFTs 570, 590 are located in parallel regions 420.

Flow directions of carriers through channels in TFTs 570, 590 approximately coincide with lengthwise directions of crystal grains in the parallel regions 420.

Flow directions of carriers through channels in TFTs 560, 580 diagonally intersect with lengthwise directions of crystal grains in zigzag regions 411.

In general, in case that polysilicon is used as a semiconductor material of TFT, carriers are scattered at grain boundaries of crystal grains. Scattering of carriers undesirably lowers the mobility. Therefore, the number of grain boundaries through which carriers must pass when flowing between the source and the drain of TFT had better be minimum. For this purpose, the flow direction of carriers and the lengthwise direction of crystal grains of polysilicon are preferably parallel. This will ensure a higher mobility of carriers in TFT.

Figure 8:
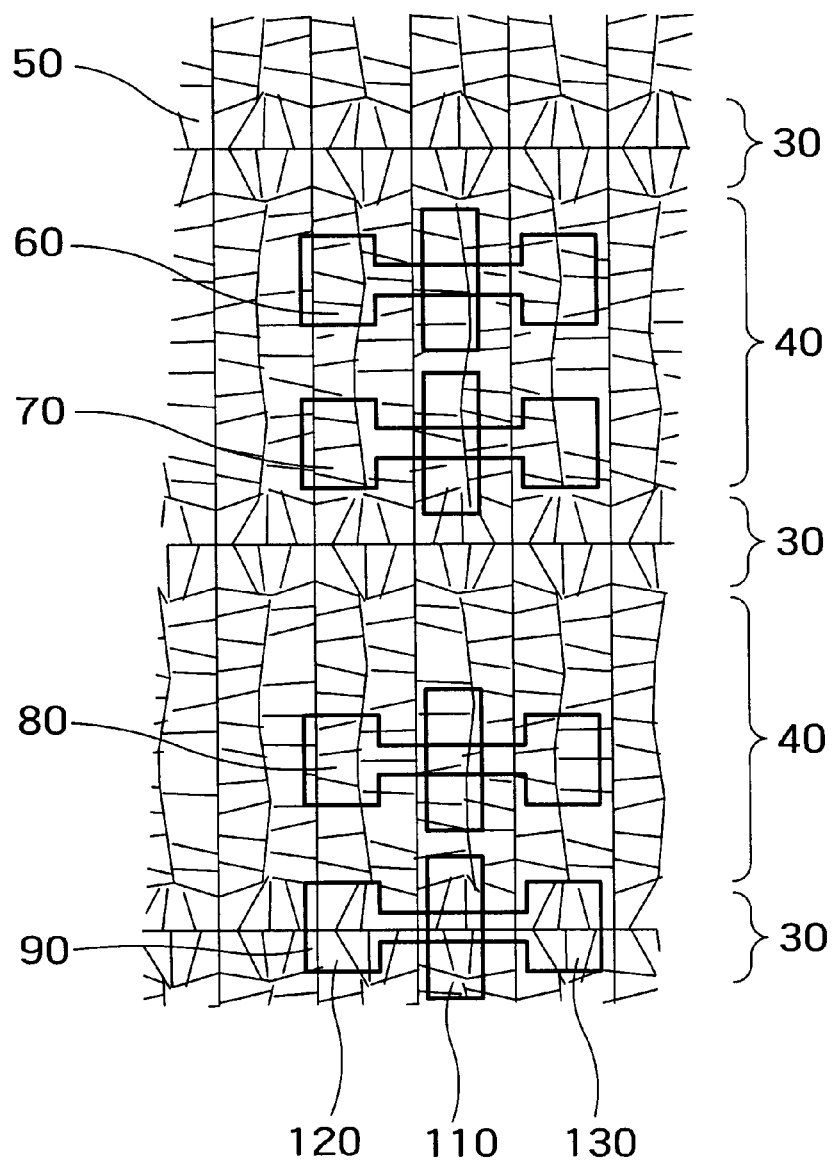
FIG. 8 is a plan view that schematically shows a layout of TFTs formed by using conventional polysilicon 230 as the active layer.

Therefore, also in TFTs 570, 590, a relatively high carrier mobility, which is substantially the same as that of TFTs 60, 80 shown in FIG. 8 can be obtained.

Carrier mobility in TFTs 560, 580 is explained below with reference to FIGS. 5A and 5B.

Figure 5A:
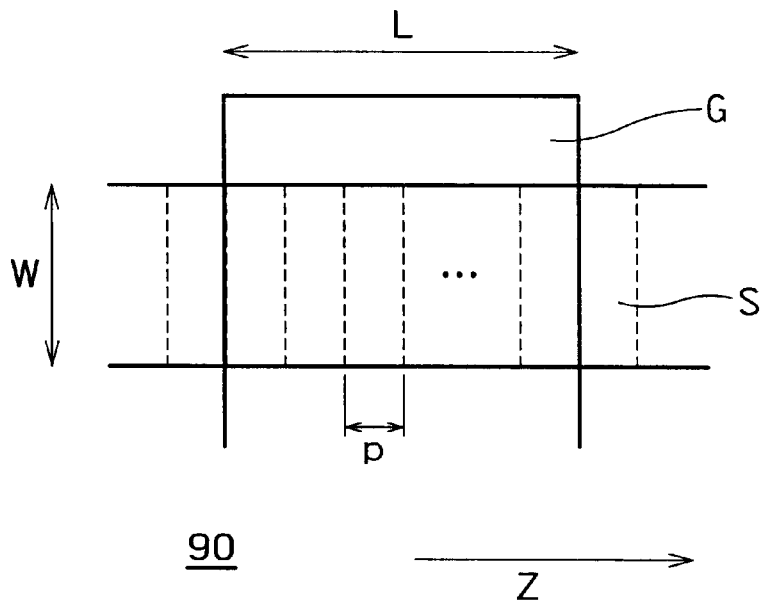
FIG. 5A is a schematic diagram for obtaining the mobility of carriers that move along the channel portion of conventional TFT.

FIG. 5A is a schematic diagram for obtaining the mobility of carriers that move along the channel portion of conventional TFT 90 shown in FIG. 8.

Figure 5B:
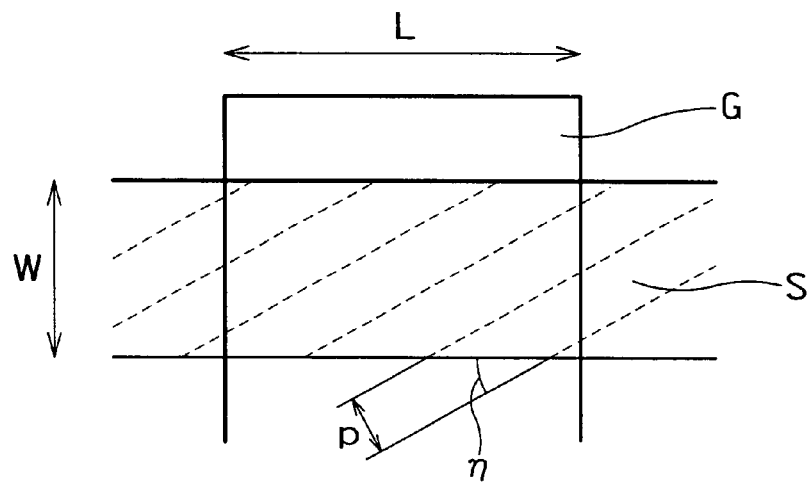
FIG. 5B is a schematic diagram for obtaining the mobility of carriers that move along the channel portion of TFT according to the embodiment of the invention shown in FIG. 4.

FIG. 5B is a schematic diagram for obtaining the mobility of carriers that move along the channel portion of TFTs 560, 580 according to the embodiment of the invention shown in FIG. 4.

The channel length and the channel width of each TFT are shown by L and W, respectively. Grain boundaries of crystal grains of polysilicon are shown by broken lines. Let each crystal grain have the width p. G is the gate electrode, and S is polysilicon. The arrow mark Z indicates the flow direction of carriers in the channel.

In FIG. 5A, grain boundaries are make 90 degrees relative to the carrier flow direction. In FIG. 5B, grain boundaries intersect with the carrier flow direction at an angle η. The angle q depends upon the angles $\theta_1$, $\theta_2$, $\theta_3$ and $\theta_4$ of FIG. 2B. That is, any one of equation among $\eta=180-\theta_1$, $\eta=180-\theta_2$, $\eta=180-\theta_3$ and $\eta=180-\theta_4$ is effective.

In the channel portion of TFT 90, the number of crystal grains each carrier has to pass through is L/p. On the other hand, in the channel portion of TFT 560 or 580, the number of crystal grains each carrier has to pass through is sin(η) *L/p. Since 0°<η<90°, the number of crystal grains each carrier has to pass through is less in TFT 560 or 580 than in TFT 90. Therefore, the number of grain boundaries each carrier has to cross is less in TFT 560 or 580 than in TFT 90. As a result, TFT 560 or 580 exhibits higher carrier mobility than TFT 90. The angle η may be determined appropriately such that desired carrier mobility is obtained for the design. Further, η may be diminished toward zero by elongating the slanting direction lines 340, 345, 350, 355 shown in FIG. 2A. Thereby, the carrier mobility of TFT 560 or 580 can be approximately equalized to the carrier mobility of TFT 570 or 590.

FIGS. 6A through 6D show other forms of transparent region 310 of the photo mask 300 shown in FIG. 2A.

In FIG. 6A, each of the slanting direction lines 340, 345, 350, 355 of the transparent region 310 curves inward of the transparent region 310 toward the opposed direction of the lengthwise direction lines 330,335 in form of an elliptical arc.

In FIG. 6B, each of the slanting direction lines 340, 345, 350, 355 of the transparent region 310 curves outward of the transparent region 310 oppositely from the opposed direction of the lengthwise direction lines 330, 335. Thus the transparent region 310 has an elliptical form.

In FIG. 6C, each of the slanting direction lines 340, 345 of the transparent region 310 curves inward of the transparent region 310 to form an elliptical arc, whereas each of the slanting direction lines 350, 355 curves outward of the transparent region 310.

In FIG. 6D, slanting direction lines 340, 345, 350, 355 of the transparent region 310 are replaced by slanting direction line 640 including a plurality of short sides 640a and 640b, slanting direction line 645 including a plurality of short sides 645a and 645b, slanting direction line 650 including a plurality of short sides 650a and 650b, and slanting direction line 655 including a plurality of short sides 655a and 655b.

Thereby, the transparent region 310 may be decagonal instead of being hexagonal, or even a polygon other than hexagon or decagon by including or decreasing the short sides.

When using the photo mask according to the embodiment having the transparent region shown in FIG. 6A, FIG. 6B, FIG. 6C or FIG. 6D, energy beams are repetitively irradiated to polysilicon in the part of the transparent region adjacent to the short sides or slanting direction lines when they are irradiated to such parts of other transparent regions. Therefore, it is prevented that the channel portion is not sufficiently irradiated with energy lines and undesirably remain amorphous.

Each slanting direction line should be construed to involve any number of short lines. Therefore, each slanting direction line can be a single short side instead of a plurality of short sides.

The TFT array substrate 130 can be manufactured by using any one of the photo masks 300 shown in FIG. 3A and FIGS. 6A through 6D. FIGS. 9A through 9F are flow charts of a manufacturing method of the array substrate according to the embodiment of the invention.

Figure 9A:
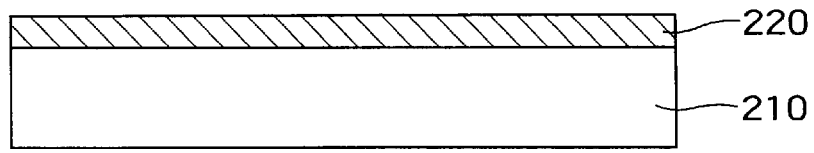
FIG. 9A is a flow chart of a manufacturing method of an array substrate according to an embodiment of the invention.

As shown in FIG. 9A, an insulating film 220 for preventing diffusion of impurities is first formed on an insulating glass substrate by PE-CVD (plasma-enhanced chemical vapor deposition).

Figure 9B:
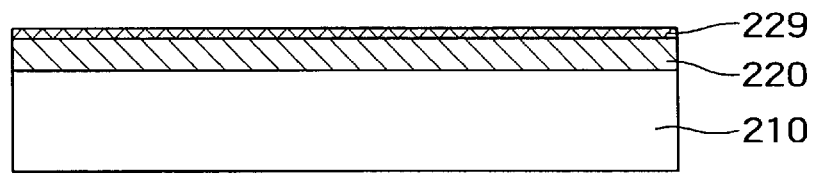
FIG. 9B is a flow chart of the array substrate manufacturing method, which is continuous from FIG. 9A.

As shown in FIG. 9B, amorphous silicon 229 to form an active layer is next deposited up to the thickness around 50 nm on the insulating film 220 by PE-CVD. The substrate is next annealed at 500° C. to deprive oxygen of the amorphous silicon 229. It is also acceptable to change the amorphous silicon 229 to a low-concentrated impurity layer by ion implantation of low-concentrated boron (B) into the amorphous silicon 229.

Figure 9C:
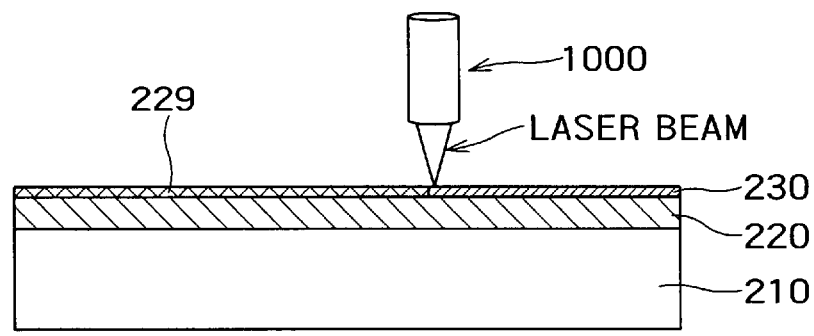
FIG. 9C is a flow chart of the array substrate manufacturing method, which is continuous from FIG. 9B.

As shown in FIG. 9C, energy beams emitted from an excimer laser generator 1000 having an energy source, such as excimer laser beams by ELA (excimer laser annealing), are next irradiated onto the amorphous silicon 229. Intensity of the excimer laser should be enough to melt the amorphous silicon 229, namely in the range from 400 mj/cm$^2$ to 600 mj/cm$^2$. Thus the amorphous silicon 229 melts and crystallizes as already explained with reference to FIG. 2B. As a result, the amorphous silicon 229 changed to polycrystalline silicon 230. Details of the process of irradiating energy beams to the amorphous silicon 229 will be explained later with reference to FIG. 10 and FIG. 11.

Figure 9D:
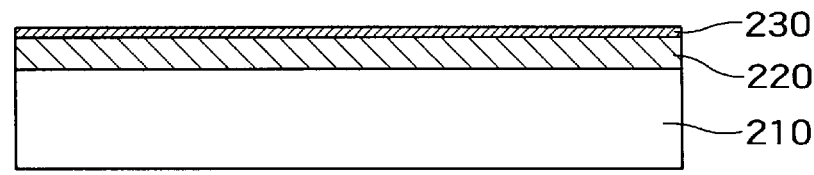
FIG. 9D is a flow chart of the array substrate manufacturing method, which is continuous from FIG. 9C.

FIG. 9D shows the state where the amorphous silicon 229 on the insulating film 220 has entirely crystallized to polysilicon 230.

After that, the polysilicon 230 is patterned by photo etching to form a resist pattern (not shown).

Figure 9E:
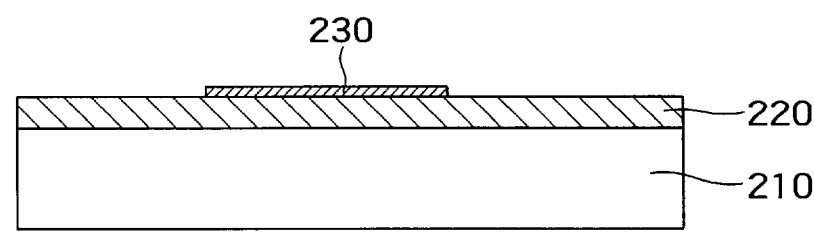
FIG. 9E is a flow chart of the array substrate manufacturing method, which is continuous from FIG. 9D.

As shown in FIG. 9E, the polysilicon 230 is selectively removed by CDE using the resist pattern as a mask.

Figure 9F:
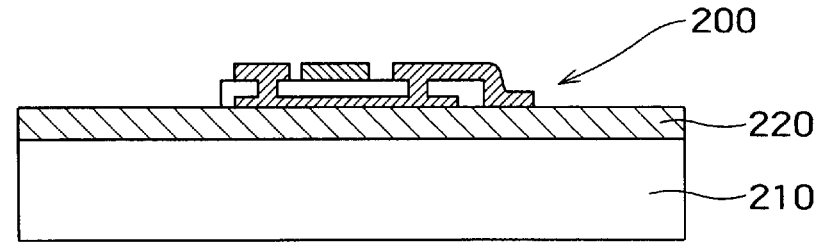
FIG. 9F is a flow chart of the array substrate manufacturing method, which is continuous from FIG. 9E.

As shown in FIG. 9F, TFT 200 is formed on the remaining part of the polysilicon on the insulating film 220 as shown in FIG. 1B.

As such, the TFT array substrate 130 is manufactured following the flow of FIGS. 9A through 9F.

Figure 10:
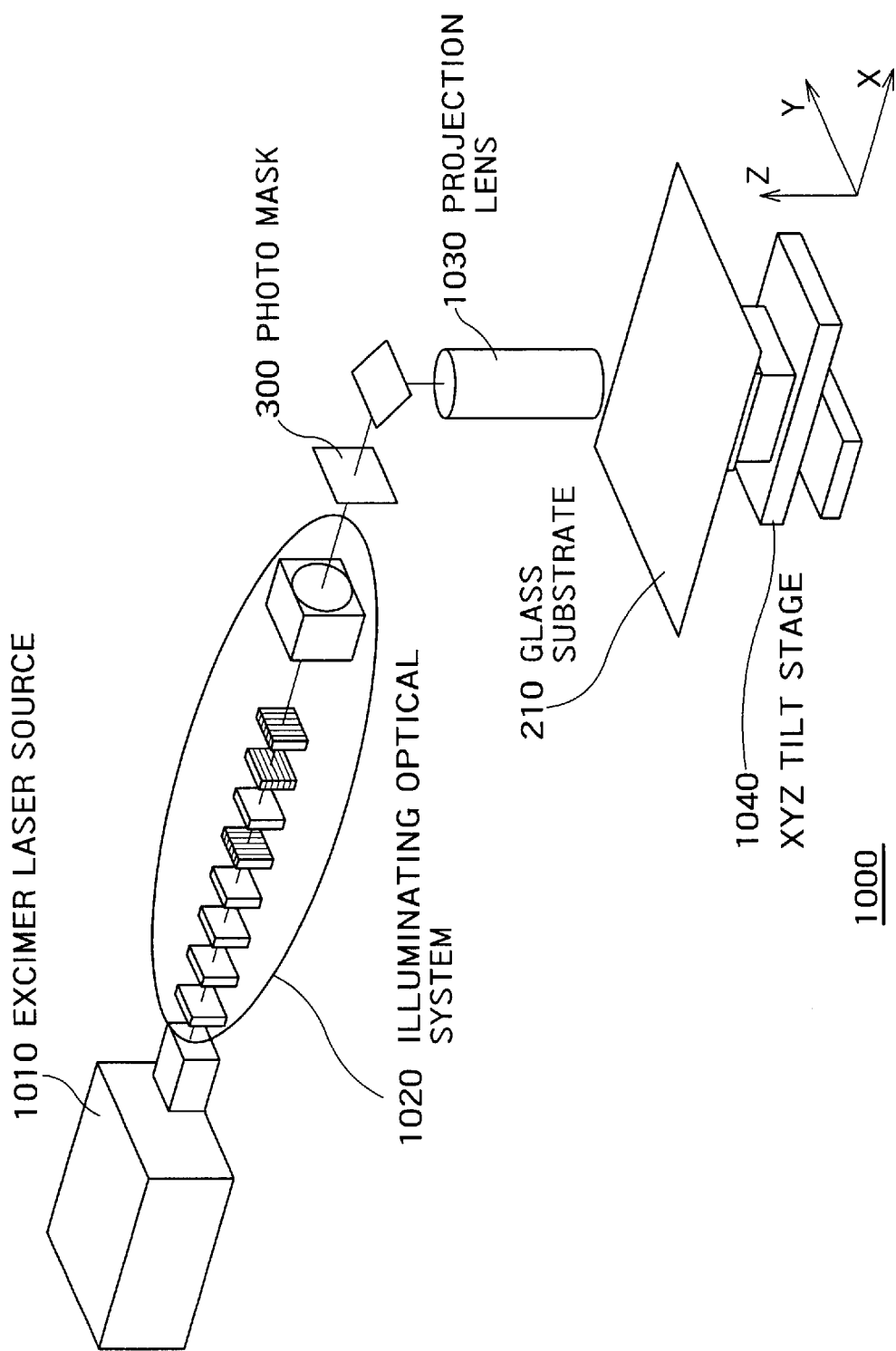
FIG. 10 is a schematic diagram that shows irradiation of energy beams from an excimer laser generator 1000.
Figure 11:
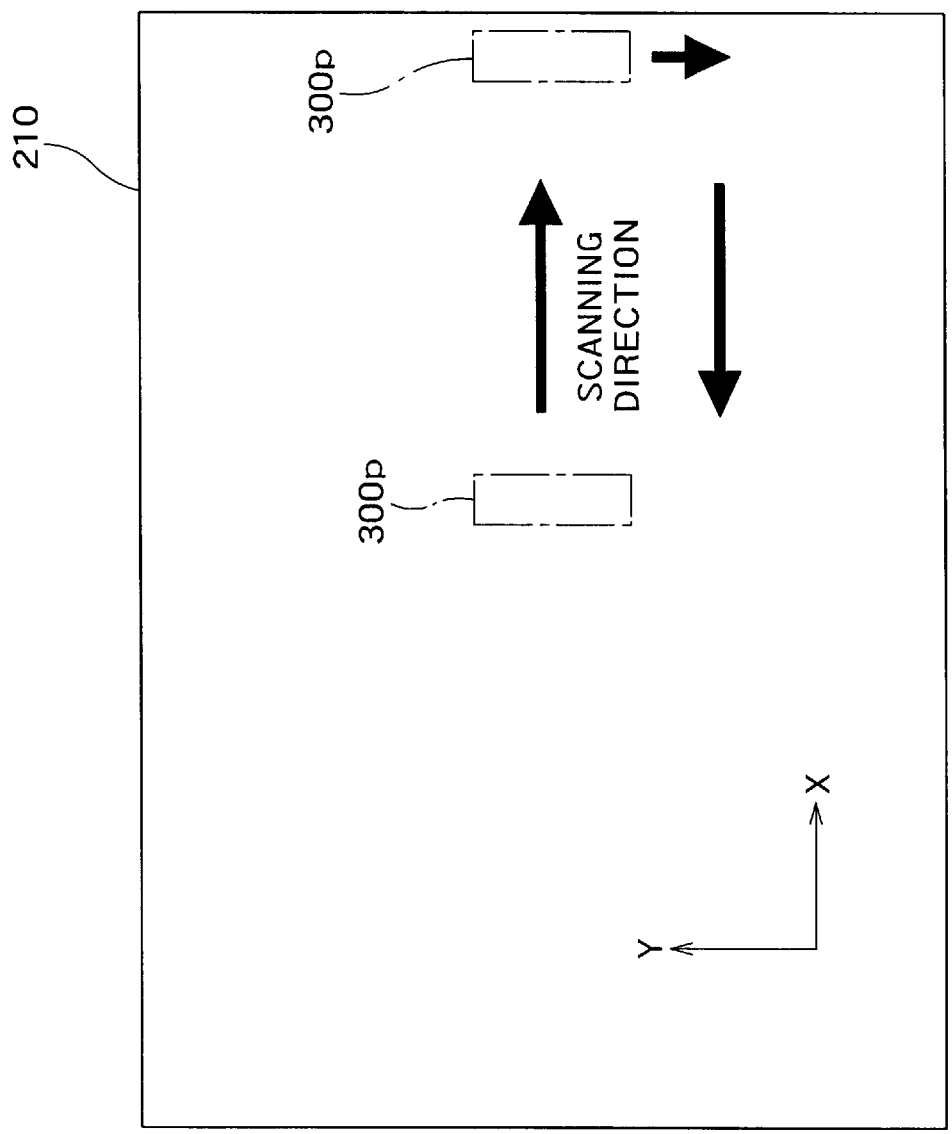
FIG. 11 is a schematic diagram that shows scanning of a glass substrate with a mask pattern.

Next referring to FIG. 10 and FIG. 11, the process of irradiating energy beams to the amorphous silicon 229 shown in FIG. 9C is briefly explained.

FIG. 10 is a schematic diagram that shows how the excimer laser generator 1000 irradiates energy beams onto the glass substrate 210 having the amorphous silicon 229. Laser beams emitted from an excimer laser source 1010 travel through the illuminating optical system 1020, photo mask 300 and projection lens 1030, and reach the amorphous silicon 229 on the glass substrate 210.

The glass substrate 210 is fixed on a XYZ tilt stage 1040, and can be moved in three-dimensional directions (XYZ directions) by driving the tilt stage 1040. After every movement of the glass substrate 210 in the X direction by a certain distance (hereinbelow also referred to as stepping motion), the excimer laser generator 1000 irradiates laser beams to the amorphous silicon 229. Laser beams passing through the photo mask 300 are converged by the projection lens 1030 and thereafter irradiated onto the amorphous silicon 229.

FIG. 11 is a schematic diagram that shows an aspect of scanning of the glass substrate with the mask pattern 300p. X-Y axes shown in FIG. 11 are the same as the X-Y axes on the moving plane of the tilt stage 1040 shown in FIG. 10. The mask pattern 300p is the pattern projected onto the surface of the amorphous silicon 229 when laser beams are irradiated onto the amorphous silicon 229.

In stepping motion, in general, the glass substrate 210 put on the tilt stage 1040 is moved. However, for easier understanding, FIG. 11 shows the glass substrate 210 as being fixed and the mask pattern of the photo mask 300 as moving. Of course, it is also possible to actually move the photo mask 300 for scanning by the mask pattern.

In the plane of the glass substrate 210, the mask pattern 300p of the photo mask 300 scans in the X-axis direction.

This scanning is a motion carried out by continuously repeating stepping motions, and after every stepping motion, laser beams are irradiated onto the amorphous silicon 229. Once the mask pattern 300p scan the glass substrate 210 to its perimeter, it moves in the Y-axis direction and scans back in the X-axis direction.

The manufacturing method of the array substrate according to the embodiment of the invention crystallizes the amorphous silicon 229 to the polysilicon 230 by irradiation of laser beams through the photo mask 300. Therefore, the method can ensure the proper effect of the use of the photo mask 300. That is, this method can manufacture an array substrate having a plurality of TFTs exhibiting high carrier mobility and constant performance without the need of limiting the design or using an additional step in the TFT manufacturing process.

As described above, according to the method for manufacturing an array substrate and the photo mask therefor according to the embodiment of the invention, it is possible to form an active layer permitting a plurality of TFTs to be made while ensuring a high carrier mobility and a constant performance thereof, without the need of limiting the design or using an additional step in the TFT manufacturing process.

What is claimed is:

1. A method of manufacturing an array substrate comprising:
   depositing an amorphous material on a transparent substrate; and
   changing said amorphous material to a polycrystalline material by irradiation of energy beams through a photo mask, said mask including a transparent region permitting said energy beams to pass through and a shutoff region surrounding said transparent region and interrupting said energy beams, said transparent region being defined by first and second lengthwise direction lines extending substantially in parallel to each other, first and second slanting direction lines which extend from opposed ends of said lengthwise direction lines after declining by angles larger than 90 degrees to join with each other; and third and fourth slanting direction lines which extend from the other opposed ends of said lengthwise direction lines after declining by angles larger than 90 degrees to join with each other, said transparent region having a length in the extending direction of said first and second lengthwise direction lines, which is longer than the length of said transparent region in the direction perpendicular to the extending direction of said first and second lengthwise direction lines,
   wherein changing said amorphous material to the polycrystalline material includes: moving said transparent substrate by a constant distance perpendicularly to the lengthwise direction of a flat pattern projected onto the surface of said amorphous material when energy beams passing through said transparent region are irradiated onto said amorphous material; and irradiating said energy beams onto said amorphous material every time when said transparent substrate is moved.

2. The method of manufacturing an array substrate according to claim 1 wherein said first and second slanting direction lines are shorter than said first and second lengthwise direction lines, and said third and fourth slanting direction lines are shorter than said first and second lengthwise direction lines.

3. The method of manufacturing an array substrate according to claim 1 wherein said first and second lengthwise direction lines are substantially equal in length.

4. The method of manufacturing an array substrate according to claim 1 wherein said transparent region has a shape symmetrical about a center line between and in parallel to said first and second lengthwise direction lines.

5. The method of manufacturing an array substrate according to claim 1 wherein all of said first, second, third and fourth slanting direction lines are linear lines.

6. The method of manufacturing an array substrate according to claim 5 wherein said transparent region is hexagonal.

7. The method of manufacturing an array substrate according to claim 1 wherein one of said first, second, third and fourth slanting direction lines is arcuate or declined by an angle larger than 90 degrees.

8. A method of manufacturing an array substrate comprising:
   depositing an amorphous material on a transparent substrate; and
   changing said amorphous material to a polycrystalline material made of crystal grains by irradiation of energy beams through a photo mask permitting said energy beams to pass through, said photo mask including an elongated transparent region configured to permit said crystal grains to grow in directions not crossing at right angles when said energy beams are irradiated onto said amorphous material, said photo mask further including a shutoff region surrounding said transparent region to interrupt said energy beams,
   wherein changing said amorphous material to a polycrystalline material includes: moving said transparent substrate by a constant distance perpendicularly to the lengthwise direction of a flat pattern projected onto the surface of said amorphous material when energy beams pass through said transparent region and are irradiated onto said amorphous material; and irradiating said energy beams onto said amorphous material every time when said transparent substrate is moved.

9. The method of manufacturing an array substrate according to claim 8 wherein irradiating said energy beams causes said crystal grains to start growing in parallel directions.

10. A photo mask permitting energy beams emitted from an energy source to pass through to change an amorphous material to a polycrystalline material, comprising:
    a transparent region permitting said energy beams to pass through and defined by first and second lengthwise direction lines extending substantially in parallel to each other, first and second slanting direction lines which extend from opposed ends of said lengthwise direction lines after declining by angles larger than 90 degrees to join with each other, and third and fourth slanting direction lines which extend from the other opposed ends of said lengthwise direction lines after declining by angles larger than 90 degrees to join with each other; and
    a shutoff region surrounding said transparent region to interrupt said energy beams,
    wherein said transparent region has a length in the extending direction of said first and second lengthwise direction lines, which is longer than the length of said transparent region in the direction perpendicular to the extending direction of said first and second lengthwise direction lines.

* * * * *